United States Patent [19]

Nagano et al.

[11] Patent Number: 5,234,537
[45] Date of Patent: Aug. 10, 1993

[54] DRY ETCHING METHOD AND ITS APPLICATION

[75] Inventors: Tetsuya Nagano; Masaru Koeda, both of Kyoto, Japan

[73] Assignee: Shimadzu Corporation, Nagakyo, Japan

[21] Appl. No.: 854,684

[22] Filed: Mar. 20, 1992

[30] Foreign Application Priority Data

Mar. 22, 1991 [JP] Japan .................................. 3-57524
Apr. 25, 1991 [JP] Japan .................................. 3-94518

[51] Int. Cl.$^5$ ..................... B44C 1/22; H01L 21/306; G02B 5/18
[52] U.S. Cl. ..................... 156/643; 156/659.1; 156/662; 252/79.1; 359/566
[58] Field of Search ............ 156/643, 657, 656, 659.1, 156/662, 663, 654, 646; 252/79.1; 204/192.32, 192.37, 192.34; 359/566, 569, 571, 574

[56] References Cited

U.S. PATENT DOCUMENTS

| | | | |
|---|---|---|---|
| 4,124,473 | 11/1978 | Lehmann et al. | 204/192.37 X |
| 4,131,506 | 12/1978 | Namba et al. | 204/192.34 X |
| 4,865,685 | 9/1989 | Palmour | 156/643 |
| 4,981,551 | 1/1991 | Palmour | 156/643 |
| 5,005,075 | 4/1991 | Kobayashi et al. | 156/643 X |

FOREIGN PATENT DOCUMENTS 0386518  9/1990  European Pat. Off. .
0428390A2  5/1991  European Pat. Off. .
3615519A1  11/1987  Fed. Rep. of Germany .

OTHER PUBLICATIONS

Chemical Abstracts, vol. 116, No. 12, 1992, No. 116984S, E. Ishiguro et al., "Fabrication and Characterization of Reactive Ion Beam Etched Silicon Carbide Grating", p. 734, Col. 2.
Patent Abstracts of Japan, vol. 5, No. 57, JP-A-56 169 776, Dec. 26, 1981.
Patent Abstracts of Japan, vol. 7, No. 204, JP-A-58 101 428, Jun. 16, 1989.
Patent Abstracts of Japan, vol. 13, No. 195, JP-A-10 015 930, Jan. 10, 1989.

*Primary Examiner*—William A. Powell
*Attorney, Agent, or Firm*—Oliff & Berridge

[57] ABSTRACT

A dry etching method for etching a surface of a substrate with plasma of mixed gas including i) gas that is reactive to the material of the substrate, and ii) inert gas. Accumulation of reaction products between the substrate and the reactive gas ions on the substrate is effectively eliminated by the ions of the inert gas plasma. Accordingly the etching rate of the substrate is not lowered. Silicon carbide (SiC) is one of the most suitable object of the plasma etching of the present invention, since it is hard to engrave by conventional dry etching methods.

13 Claims, 6 Drawing Sheets

DRY ETCHING METHOD AND ITS APPLICATION

The present invention relates to a dry etching method, and its applications to producing a diffraction grating or other microstructures.

BACKGROUND OF THE INVENTION

Since a diffraction grating made of silicon carbide (SiC) is stable at relatively high temperature and has a good thermal conductivity, it is especially suited for synchrotron orbital radiation (hereinafter referred to as SOR) and short-wavelength, high energy laser light whose energy heats up the diffraction grating.

Direct etching of a diffraction grating pattern on an SiC substrate by dry etching such as ion beam etching is not easy, however, because the resist layer for masking the substrate surface is etched faster than the SiC substrate. Though generally the etching speed of a substrate is improved when such ions reactive to the substrate is used (Reactive Ion Etching), SiC is still too hard. Even when a gas reactive to SiC ($CHF_3$, for example) is used, the etching speed of the SiC substrate is very slow and the resist layer is exhausted faster than SiC, whereby correct grating profile is difficult to obtain.

Thus a conventional SiC diffraction grating uses a surface coating of soft metal (such as gold) in which the grating is mechanically engraved by ruling engine or such, as shown in FIG. 5. In this case, though, when the diffraction grating is irradiated by very strong light (such as SOR or high energy laser light) for a long time, the diffraction grating may distort or the surface coating may separate from the substrate due to the difference in the coefficient of thermal expansion.

A novel method of direct etching of an SiC substrate has been proposed, in which the SiC substrate is etched with high-output SOR in a gas atmosphere (Proceedings of 1990 Spring Conference, p. 500: Society of Applied Physics). This method can be used, however, only in synchrotron facilities which are yet scarce for industrial application.

SUMMARY OF THE INVENTION

The present invention provides a dry etching method that can etch that hard SiC substrate and can be exploited with ordinary dry etching instruments.

According to the present invention, a plasma etching method for etching a surface of a substrate with a plasma of a source gas is characterized in that: a mixture of gases comprising
  i) gas that is reactive to the material of the substrate, and
  ii) inert gas
is used as the source gas.

An application of the above method of the present invention is to produce a diffraction grating. For producing a diffraction grating according to the present invention, the method comprises the steps of:
  a) covering a substrate plate with a resist layer having a grating aperture pattern; and
  b) etching the substrate with a plasma using a source gas of a mixture of
    i) gas that is reactive to the material of the substrate plate and
    ii) inert gas.

SiC is one of the most suitable object of the plasma etching of the present invention, since, as explained above, it is hard to engrave by conventional methods, and SiC diffraction grating can endure the strong light of SOR or high energy laser light. But the application of the present invention is not limited to SiC. The mixture of inert gas and the reactive gas is effective in dry-etching other kinds of material that are difficult to etch by conventional methods.

In the plasma etching process, the reactive gas is ionized, accelerated by an electric field, and irradiated onto the substrate surface. The substrate surface is etched at a relatively high speed by the combined effects of: physical etching by the colliding ions; and chemical reaction of the reactive gas with the substrate.

In conventional plasma etching methods in which only the reactive gas is used, the reaction products of the substrate and the reactive gas ions are accumulated on the surface of the substrate, which prevents the further progress of etching. This accumulation of reaction products makes the etching rate of a resist layer greater than that of the substrate.

In the plasma etching of the present invention in which a mixture of the reactive gas and the inert gas is used, the accumulation of the reaction product is effectively eliminated by the ions of the inert gas plasma. Accordingly the etching rate of the substrate is not lowered but maintained at the level equivalent to or greater than the etching rate of the resist layer. Thus a direct pattern-etching using a resist mask is possible for such hard substrate that conventional plasma etching methods have been ineffective.

DETAILED DESCRIPTION OF A PREFERRED EMBODIMENT

Figure 1A:
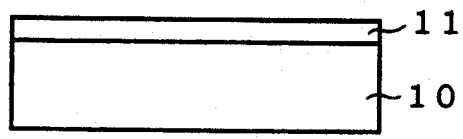
FIGS. 1A through 1E schematically show the process for etching a substrate with an arbitrary pattern according to the method of the present invention.

Silicon carbide (SiC) substrates were dry-etched according to the method of the invention and conventional methods. The difference in the etching rate between the SiC substrate and a resist was then measured in each method. In all the methods, the substrate is made of a sintered SiC base plate covered with SiC deposit through chemical vapor deposition (hereinafter referred to as CVD), and half of the surface area of the substrate is coated by a positive resist OFPR-5000 (trade name by Tokyo Ohka Corp.). Then the substrates were processed by ion beam etching.

First, the SiC substrate with the resist was etched with ion beams of the reactive gas $CF_4$ only (without inert gas). The etching rate of SiC was 72.1 (angstrom/minute)/(mA/cm$^2$) while the same of the resist was 261.3 (angstrom/minute)/(mA/cm$^2$). The ratio of the etching rate of SiC to the resist (hereinafter the ratio is referred to as "the selectivity ratio of SiC") was as small as 0.276.

Second, the SiC substrate with the resist was etched with ion beams of another reactive gas $CHF_3$ only (without inert gas). The etching rate of SiC was 27.6 (angstrom/minute)/(mA/cm$^2$) while the same of the resist was 99.0 (angstrom/minute)/(mA/cm$^2$). The etching rates of both SiC and the resist were smaller than those with $CF_4$. The selectivity ratio of SiC was also as small as 0.279.

Third, the SiC substrate with the resist was etched with inert gas argon (without the reactive gas). The etching rate of SiC was 94.6 (angstrom/minute)/(mA/cm$^2$) while the same of the resist was 325.0 (angstrom/minute)/(mA/cm$^2$). The selectivity ratio of SiC was also as small as 0.291. As clearly seen in the above results, in all the three methods, the resist was etched far faster than the SiC substrate.

The SiC substrate with the resist was then processed by ion beams of gas mixture consisting of fluoroform ($CHF_3$) and argon at the ratio of $CHF_3:Ar=33:67$. In this case, the etching rate of SIC was 164.2 (angstrom/minute)/(mA/cm$^2$) while the same of the resist was 126.9 (angstrom/minute)/(mA/cm$^2$). The selectivity ratio of SiC was as large as 1.29. Namely, the SiC substrate was etched at a greater speed than the resist in the combination of the reactive gas and the inert gas. As the result shows, the method of the invention allows direct pattern etching of silicon carbide.

Figure 1B:
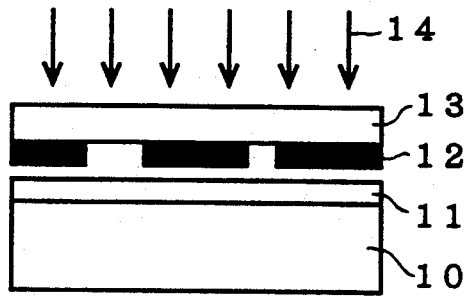
Figure 1C:
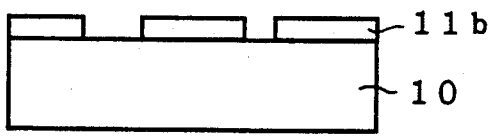
Figure 1D:
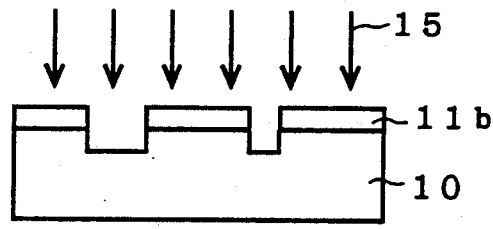
Figure 1E:

Process for etching a pattern on the surface of an SiC substrate according to the method of the invention is now described referring to FIGS. 1A through 1E. An SiC substrate (CVD-SiC) 10 is prepared by laying SiC deposit on the surface of sintered SiC base through CVD process. A resist (for example, OFPR-5000) 11 is applied with a thickness of approximately 3,000 angstrom onto the surface of the SiC substrate 10 as shown in FIG. 1A. The substrate 10 with the resist 11 is baked at 90° C. for thirty minutes in a fresh air oven for fixation of the resist 11 on the SiC substrate 10. The substrate 10 is then covered with a hard mask 13 having a mask pattern layer 12 of chromium, and is irradiated with ultraviolet rays 14 as shown in FIG. 1B. Exposed portions in the resist 11 are removed with a specific developing solution, so that a resist pattern 11b is formed on the SiC substrate 10 (FIG. 1C). The SiC substrate 10 is then irradiated by ion beams 15 of gas mixture of fluoroform and argon ($CHF_3$:Ar 33:67) (FIG. 1D). In the last step, the resist pattern 11b is ashed off with $O_2$ plasma, and the desirably etched SiC substrate 10 is thus obtained as shown in FIG. 1E. The depth of etching in the SiC substrate 10 is approximately 1,000 angstrom under the conditions of the embodiment.

Figure 2A:
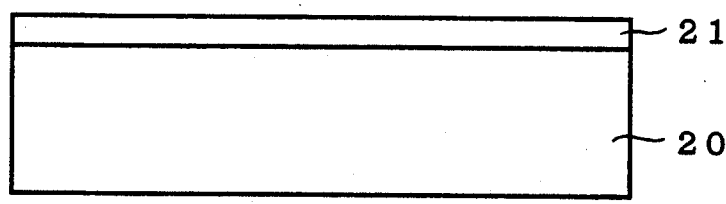
FIGS. 2A through 2E schematically show the process for producing a laminar type diffraction grating according to the method of the present invention.
Figure 2B:
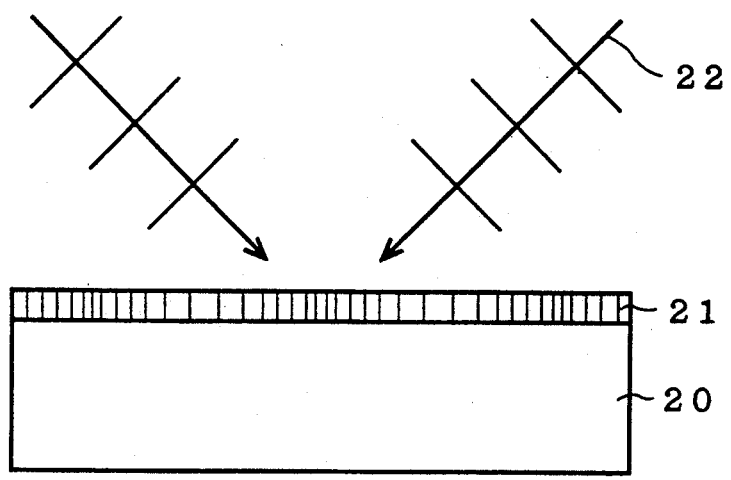
Figure 2C:
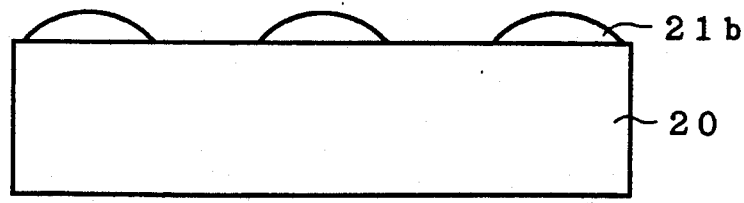

Manufacture of a laminar type SiC diffraction grating is then described according to the process of FIGS. 2A through 2E. An SiC substrate 20 is prepared by making SiC deposit on the surface of sintered SiC through CVD process. The SiC substrate 20 is optically polished and covered with a positive resist (for example, OFPR-5000) 21 by spin coating. Here the thickness of the resist layer 21 is approximately 3,000 angstrom. The substrate 20 with the resist 21 is baked at 90° C. for thirty minutes in a fresh air oven for fixation of the resist 21 on the SiC substrate 20 (FIG. 2A). The substrate 20 with the resist 21 is exposed to two plane waves 22 of different incident angles for holographic exposure, whereby a latent image of parallel interference lines are made in the resist layer 21 as shown in FIG. 2B. The plane waves can be generated by, for example, He-Cd laser (wavelength $\lambda=4,416$ angstrom). The resist 21 is then processed by a specific developing solution (for example, NMD-3) to form a laminar resist pattern 21b wherein parallel, linear resists having sinusoidal profile remain at equal intervals (FIG. 2C). Here the time periods of the exposure and the solving process (development) are set so that the substrate 20 is revealed at the exposed portions of the resist 21, and the ratio of the width of the resist 21 still covering the SiC substrate 20 to the width of the revealed SiC substrate 20 (L&S ratio) becomes a predetermined value.

The laminar resist pattern can be made by any other method, such as normal photolithography or electron beam lithography.

Figure 2D:
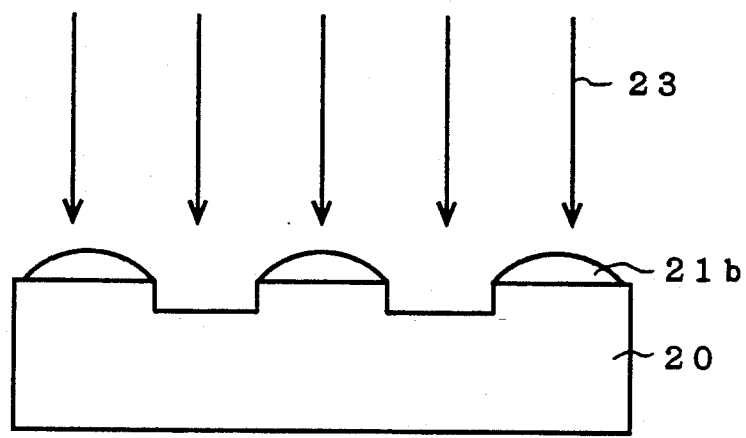
Figure 2E:
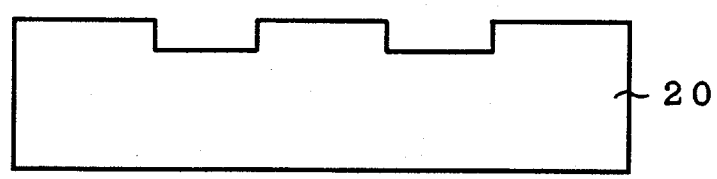

The SiC substrate 20 masked with the patterned resist 21b is irradiated by ion beams 23 of gas mixture of fluoroform and argon ($CHF_3$:Ar=33:67) perpendicularly to the surface of the substrate 20. The exposed portions of the SiC substrate 20 are selectively etched at a high speed while the resist 21b is etched at a low speed as shown in FIG. 2D. Ion beam irradiation is stopped when a predetermined etching depth is attained in the SiC substrate 20, and the remaining resist 21b is ashed off with $O_2$ plasma. Thus the laminar type diffraction grating is formed directly on the SiC substrate 20 (that is, without a surface metal coating), as shown in FIG. 2E, which has excellent heat resistance and favorable thermal conductivity (cooling efficiency). In the step of eliminating the remaining resist 21b, the SiC substrate 20 is not affected at all by $O_2$ plasma and the profile formed by the ion beam etching is preferably maintained.

Figure 3A:
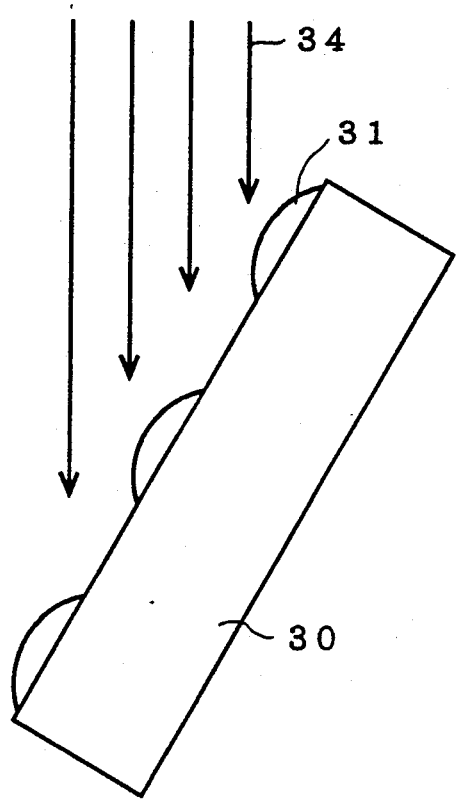
FIGS. 3A through 3C schematically show the second half of the process for producing a blazed type diffraction grating according to the method of the present invention.
Figure 3B:
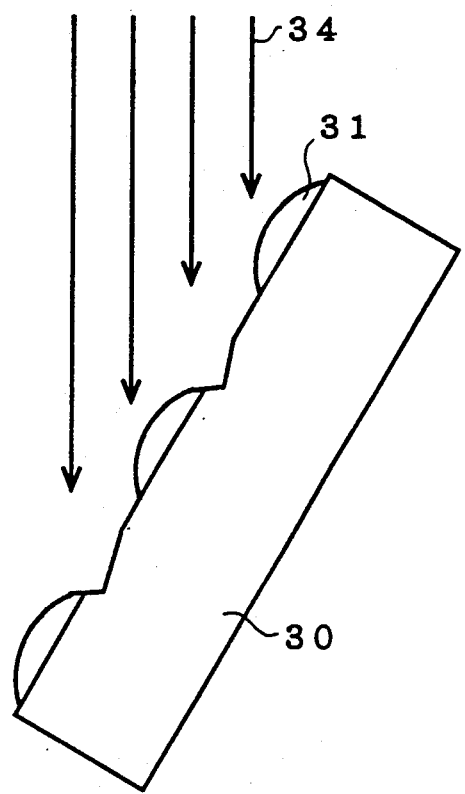
Figure 3C:
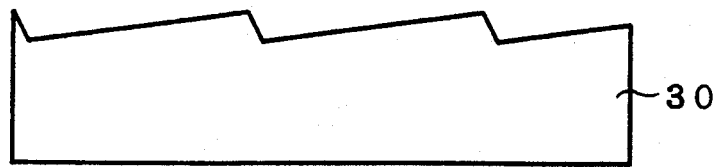

FIGS. 3A through 3C show a process for manufacturing a blazed type SiC diffraction grating. An SiC substrate 30 masked by a patterned resist 31b formed in the same manner as FIG. 2C is irradiated by ion beams 34 of the gas mixture oblique to the substrate surface and perpendicular to the resist lines (FIG. 3A). The SiC substrate 30 is obliquely etched to have the jaggy profile of blazed type diffraction grating (FIG. 3B). The incident angle of the ion beam is determined according to the blaze angle of the diffraction grating. The thickness of the resist 31b is determined so that the resist 31b is completely eliminated by the irradiation of the ion beams when the etching depth of the SiC substrate 30 reaches the predetermined value. When the ion beam irradiation is completed, the blazed type diffraction grating on the SiC substrate 30 is obtained as shown in FIG. 3C.

In the above embodiments, fluoroform and argon are respectively used for the reactive gas and the inert gas in the gas mixture, but various other combinations of reactive gas ($CF_4$ for SiC) and inert gas (such as Ne or Kr) is also applicable to the method. The ratio of the reactive gas to the inert gas at 33 to 67 (approximately one to two) in the above embodiments is the optimum value for the mixture of $CHF_3$ and argon. But other ratio is also effective in selectively etching the SiC substrate rather than the resist layer. According to further experiments in the case of the mixture of $CHF_3$ and argon, more than 50% of argon content in the gas mixture ensures a greater selectivity ratio of SiC than when etching with pure argon gas or with pure $CHF_3$ gas. But the ratio of argon content more than 90% in the mixture Yields the selectivity ratio comparable to the value at pure argon gas or pure $CHF_3$ gas. The optimum mixing ratio and the effective range of the ratio depend on the combination of inert gas and reactive gas and the SiC substrate used (for example, whether it is a sintered SiC substrate per se, a sintered SiC+CVD-SiC substrate, or a sintered C+CVD-SiC substrate).

Figure 4A:
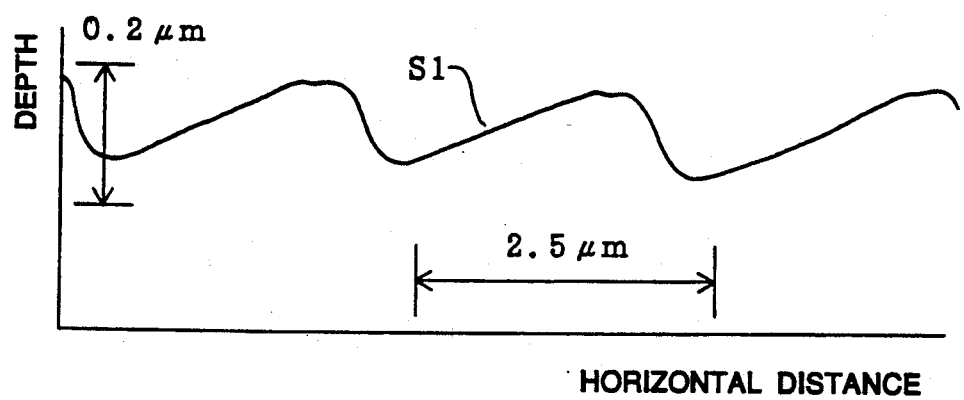
FIG. 4A is a profile of a blazed type diffraction grating produced by the method according to the present invention.
Figure 4B:
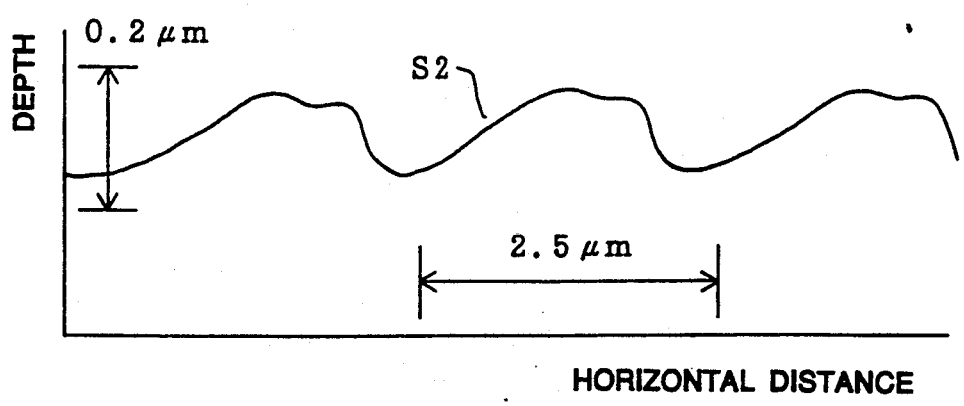
FIG. 4B is a profile of that produced by a prior art method.
Figure 5:
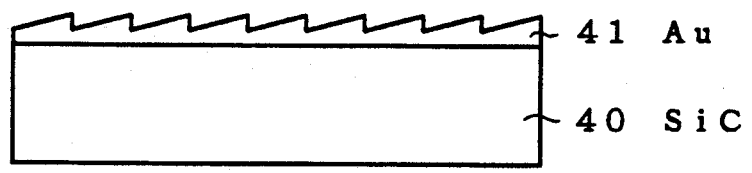
FIG. 5 is a cross sectional view of a prior art SiC diffraction grating using a gold surface coating.

The above explained method of manufacturing a blazed type diffraction grating (FIGS. 2A-2C and 3A-3C) is also effective for manufacturing a diffraction grating of normal glass substrate. In a conventional method, a glass substrate is ion beam etched with the gas (such as $CF_4$ or $CHF_3$) reactive to the main constituent $SiO_2$ of glass. But, similarly to the above case of SiC, reaction products such as C (carbon), metallic impurities from the ion beam electrode or etching chamber, or metallic compounds removed from the glass substrate accumulate on the substrate. This impairs the etched profile of the blazed type diffraction grating, as shown in FIG. 4B, in which the slanting portion S2 is rather narrow and not a perfect plane.

The same process as illustrated above (and FIGS. 2A-2C and 3A-3C) is used to manufacture a blazed type diffraction grating of glass substrate. The substrate 30 used here is normal glass (for example, BK-7 of HOYA Co., etc.), and the resist 31 is a positive type resist which is used in normal photolithography (for example, Microposit 1400 of Siplay Far East Co.). The plasma gas is the mixture of $CF_4$ and argon. In the case of glass substrate and the mixture gas of $CF_4$ and argon, a slightly broader mixture ratio is possible, such as from $CF_4:Ar=55:45$ to 10:90. FIG. 4A is the profile of the blazed type diffraction grating of glass substrate made by the method of the present invention using the mixture ratio of $CF_4:Ar=30:70$. As seen from the profile curves of FIGS. 4A and 4B, the diffraction grating made by the method of the present invention has a broader and more perfect slanting plane S1, whereby an improved monochromating performance is obtained.

The present invention is applicable not only to ion beam etching used in the above embodiments but also to plasma etchings in general. The plasma etching method of the present invention has another effect. Besides eliminating accumulation on the substrate, the inert gas ions clear the surface of the inner wall of the etching chamber as well.

What is claimed is:

1. A plasma etching method comprising the steps of:
   etching a surface of silicon carbide (SiC) with a plasma of a source gas; and
   using a mixture of gases as the plasma of the source gas, the source gas comprising a mixture of $CHF_3$ and argon.

2. The plasma etching method according to claim 1, where the ratio of the mixture is $CHF_3:Ar=50:50$ to 10:90.

3. A plasma etching method comprising the steps of:
   etching a surface of glass with a plasma of a source gas; and
   using a mixture of gases as the plasma of the source gas, the source gas comprising a mixture of $CF_4$ and argon.

4. The plasma etching method according to claim 3, where the ratio of the mixture is $CF_4:Ar=55:45$ to 10:90.

5. A method for producing a diffraction grating comprising the steps of:
   a) covering a substrate plate with a resist layer having a grating aperture pattern; and
   b) etching the substrate with a plasma using a source gas of a mixture of
      i) gas that is reactive to the material of the substrate plate, and
      ii) inert gas.

6. The diffraction grating producing method according to claim 5, where the material of the substrate plate is silicon carbide (SiC).

7. The diffraction grating producing method according to claim 6, where the gas that is reactive to SiC is $CHF_3$ and the inert gas is argon.

8. The diffraction grating producing method according to claim 7, where the ratio of the mixture is $CHF_3:Ar=50:50$ to 10:90.

9. The diffraction grating producing method according to claim 5, where the material of the substrate is glass.

10. The diffraction grating producing method according to claim 9, where the gas that is reactive to glass is $CF_4$ and the inert gas is argon.

11. The diffraction grating producing method according to claim 10, where the ratio of the mixture is $CF_4:Ar=55.45$ to 10:90.

12. The diffraction grating producing method according to claim 5, where the plasma is irradiated oblique to the surface of the substrate plate and perpendicular to the grating lines.

13. A diffraction grating of silicon carbide (SiC) produced by the steps of:
   a) covering an SiC substrate plate with a resist layer having a grating aperture pattern; and
   b) etching the SiC substrate with a plasma using a source gas of a mixture of
      i) gas that is reactive to SiC, and
      ii) inert gas.

* * * * *